(12) United States Patent
Frosien

(10) Patent No.: US 8,921,804 B2
(45) Date of Patent: Dec. 30, 2014

(54) HIGH BRIGHTNESS ELECTRON GUN WITH MOVING CONDENSER LENS

(71) Applicant: ICT Integrated Circuit Testing Gesellschaft für Halbleiterprüftechnik GmbH, Heimstetten (DE)

(72) Inventor: Jürgen Frosien, Riemerling (DE)

(73) Assignee: ICT Integrated Circuit Testing Gesellschaft für Halbleiterprüftechnik GmbH, Heimstetten (DE)

( * ) Notice: Subject to any disclaimer, the term of this patent is extended or adjusted under 35 U.S.C. 154(b) by 74 days.

(21) Appl. No.: 13/621,720

(22) Filed: Sep. 17, 2012

(65) Prior Publication Data

US 2013/0327951 A1 Dec. 12, 2013

(30) Foreign Application Priority Data

Jun. 6, 2012 (EP) .................................... 12171023

(51) Int. Cl.
 *H01J 3/20* (2006.01)
(52) U.S. Cl.
 USPC ................. 250/396 R; 250/310; 250/396 ML
(58) Field of Classification Search
 CPC .......................................................... H01J 3/26
 USPC .................................................... 250/396 R
 See application file for complete search history.

(56) References Cited

U.S. PATENT DOCUMENTS

| | | | | |
|---|---|---|---|---|
| 5,708,274 A | * | 1/1998 | Langner et al. | 250/396 ML |
| 5,831,270 A | * | 11/1998 | Nakasuji | 250/396 ML |
| 5,994,708 A | | 11/1999 | Nakasuji | |
| 7,633,074 B2 | * | 12/2009 | Frosien | 250/492.23 |
| 8,101,911 B2 | * | 1/2012 | Adamec | 250/310 |
| 2012/0091359 A1 | * | 4/2012 | Lanio et al. | 250/396 R |

FOREIGN PATENT DOCUMENTS

| | | |
|---|---|---|
| EP | 1389797 A2 | 2/2004 |
| JP | 4-85643 | 7/1992 |
| WO | WO-0014766 A1 | 3/2000 |

OTHER PUBLICATIONS

European Search Report for 12171023.0; 6 pages; Nov. 8, 2012.

* cited by examiner

*Primary Examiner* — Phillip A Johnston
(74) *Attorney, Agent, or Firm* — Patterson & Sheridan, LLP

(57) ABSTRACT

A condenser lens arrangement for an electron beam system is described. The condenser lens arrangement includes a magnetic condenser lens adapted for generating a magnetic condenser lens field, the condenser lens having a symmetry axis, and a magnetic deflector adapted for generating a magnetic deflector field. The deflector is configured so that the superposition of the magnetic condenser lens field and the magnetic deflector field results in an optical axis of the condenser lens arrangement being movable relative to the symmetry axis. Further, an electron beam optical system including a condenser lens arrangement and a method for moving a condenser lens are described.

18 Claims, 5 Drawing Sheets

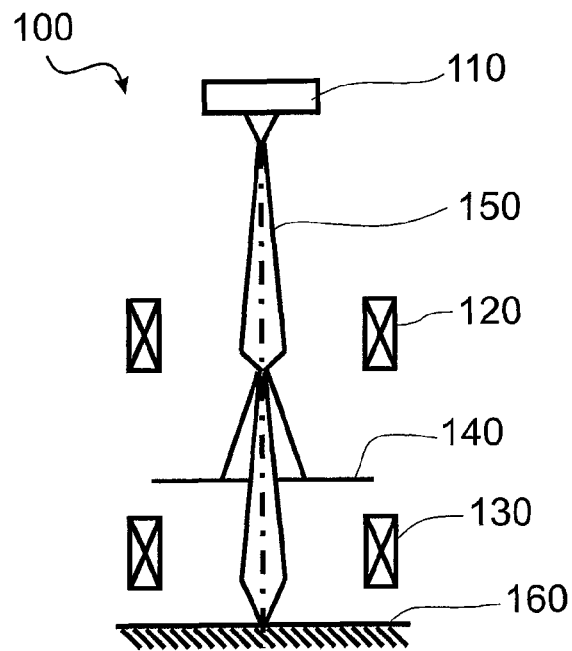
FIG. 1a (state of the art)
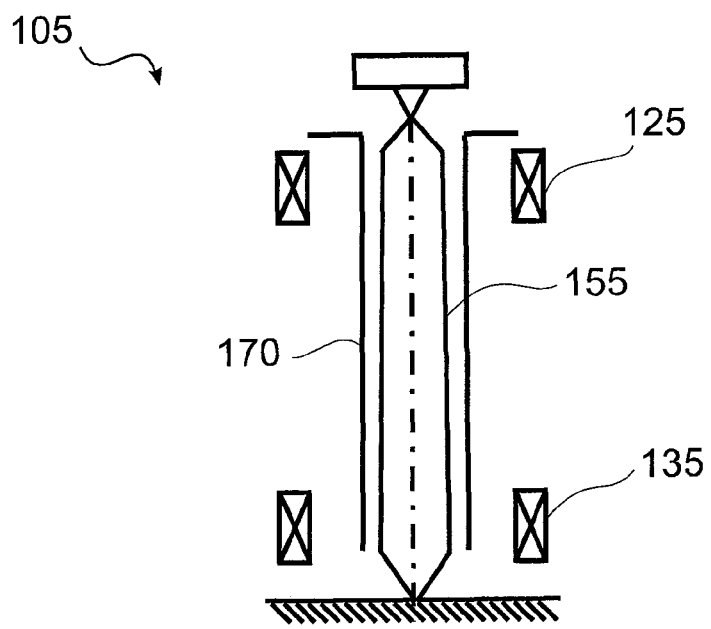
FIG. 1b (state of the art)

HIGH BRIGHTNESS ELECTRON GUN WITH MOVING CONDENSER LENS

TECHNICAL FIELD OF THE INVENTION

Embodiments of the present invention relate to an electron beam system and a condenser lens arrangement for an electron beam system. Embodiments of the present invention particularly relate to a high brightness electron beam system having a condenser lens arrangement, a condenser lens arrangement for a high brightness electron beam system and a method for operating a condenser lens arrangement in a high brightness electron beam system.

BACKGROUND OF THE INVENTION

Charged particle beam apparatuses, such as electron beam apparatuses have many functions in a plurality of industrial fields, including, but not limited to, inspection of semiconductor devices during manufacturing, exposure systems for lithography, detecting devices and testing systems.

Charged particle beams, e.g. electron beams are often used for micrometer and nanometer scale process control, inspection or structuring, wherein the charged particles are generated and focused in charged particle beam devices, such as electron microscopes or electron beam pattern generators. Charged particle beams offer superior spatial resolution compared to, e.g. photon beams due to their short wavelengths.

For instance, scanning electron microscopes (SEM) are used for many applications for high resolution surface imaging. In particular, low voltage SEMs with electron beam energies of 50 eV to 5 keV are widely used in applications where sample damage and sample charging should be avoided. Electron beam metrology and electron beam inspection are only a few application areas for semiconductor device manufacturing.

In general, mainly two basic requirements are to be considered for SEM columns. Firstly, the highest possible resolution should be achieved, which means a small spot size of the electron probe, preferably in the sub-nanometer range. Secondly, the highest possible probe current should be used in a given probe diameter. From this, two requirements for the design of the SEM optics result. The first requirement is a high brightness electron source. The second requirement is a low aberration objective lens for focusing the beam onto the sample, which means low chromatic aberration in the high resolution case, and low spherical aberration in mid-size, high current cases.

In view of the above, it is an object of the present invention to provide an electron beam system and optics for the electron beam system which provide a high brightness and a small virtual size, and, at the same time, low aberrations and good alignment of the electron beam in the electron beam system.

SUMMARY OF THE INVENTION

In light of the above, a condenser lens arrangement for an electron beam system according to independent claim 1, an electron beam system according to independent claim 6, and a method for moving a condenser lens according to independent claim 12 are provided.

Further aspects, advantages, and features of the present invention are apparent from the dependent claims, the description, and the accompanying drawings.

According to one embodiment, a condenser lens arrangement for an electron beam system is provided. The condenser lens arrangement includes a magnetic condenser lens adapted for generating a magnetic condenser lens field, wherein the magnetic condenser lens has a symmetry axis. Further, the condenser lens arrangement includes a magnetic deflector adapted for generating a magnetic deflector field. The deflector of the condenser lens arrangement according to an embodiment is configured so that that the superposition of the magnetic condenser lens field and the magnetic deflector field results in an optical axis of the condenser lens arrangement being movable relative to the symmetry axis of the condenser lens.

According to another embodiment, an electron beam system is provided. The electron beam system includes a particle beam emitter for generating a beam of charged particles, a condenser lens arrangement, and an objective lens for focusing the particle beam on a specimen. In one embodiment, the condenser lens arrangement includes a magnetic condenser lens adapted for generating a magnetic condenser lens field, wherein the magnetic condenser lens has a symmetry axis. Further, the condenser lens arrangement includes a magnetic deflector adapted for generating a magnetic deflector field. The deflector of the condenser lens arrangement is configured so that that the superposition of the magnetic condenser lens field and the magnetic deflector field results in an optical axis of the condenser lens arrangement being movable relative to the symmetry axis of the condenser lens.

According to a further embodiment, a method for moving a condenser lens in a condenser lens arrangement is provided. The method includes generating a first magnetic lens field with a magnetic condenser lens, which has a symmetry axis; generating a second magnetic field with a magnetic deflector, and superposing the second magnetic field of the deflector with the first magnetic field of the condenser lens to move an optical axis of the condenser lens arrangement relative to the symmetry axis of the condenser lens.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 1a shows an electron beam system having a thermal field emitter (TFE) with a first beam path according to the state of the art;

FIG. 1b shows an electron beam system having a cold field emitter (CFE) with a second beam path according to the state of the art;

DETAILED DESCRIPTION OF EMBODIMENTS

Figure 2:
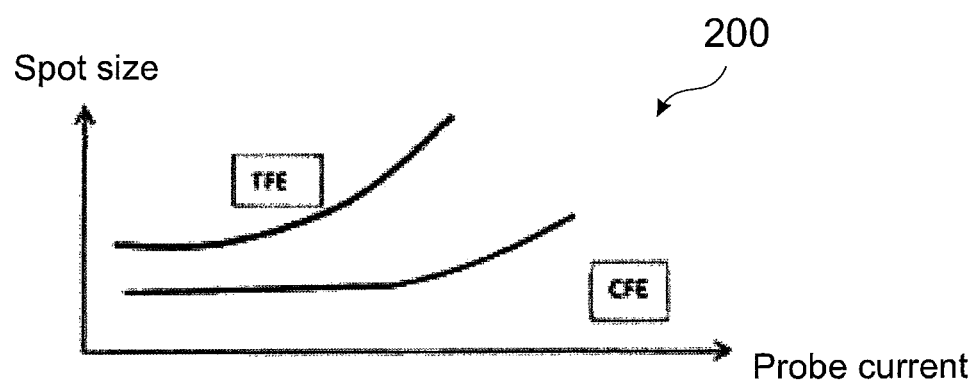
FIG. 2 shows a diagram of the spot size over the probe current of a TFE and a CFE, respectively, according to the state of the art.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Furthermore, in the following description, a "magnetic deflector" may be understood as a device being able to generate a magnetic field. In particular, the magnetic field generated by the deflector may be adapted for influencing the beam path of an electron beam. Embodiments described herein provide a magnetic deflector including one or more coils, which may generate a magnetic field in the x- and/or the y-direction.

According to some embodiments described herein, the "superposition" of magnetic fields should be understood as an overlap of at least two magnetic fields. An overlap of at least two magnetic fields may be defined as an overlap of the magnetic field regions having at least between about 5% to about 50%, more typically between about 10% to 30%, and even more typically between about 10% and 20% of the maximum field strength of the respective field. According to some embodiments, the superposed magnetic fields may have an overlap region, in which the magnetic fields influence each other. For example, a first magnetic field may be generated and may be influenced by a second magnetic field, as needed. The superposition of the at least two magnetic fields may result in an increase in the magnetic field strength, a shift in the magnetic field distribution, a distortion of the magnetic field distribution, or the like. Furthermore, a device being adapted or configured to generate a superposing magnetic field may be adapted to be controlled and driven if required. For instance, the field strength of the device may be adjusted so as to achieve a desired interaction between the superposed magnetic fields.

Further, according to some aspects of embodiments described herein, a "symmetry axis" of a device may be the geometrical symmetry axis of the device. According to some embodiments, an "optical axis" of an arrangement or an optical system is an imaginary line that defines the path along which the beam propagates through the system. For instance, in a system composed of electron beam optical elements, the axis may pass through the center of the elements. The optical axis may be coincident with the mechanical or geometrical symmetry axis of the system, but does not necessarily have to be, as explained in detail below.

According to some embodiments, the condenser lens arrangement provided allows for a movable condenser lens field in the condenser lens arrangement. The condenser lens field may be moved with respect to the symmetry axis of the condenser lens by the superposition of a further magnetic field. In that way, the optical axis of the condenser lens arrangement is moved with respect to the symmetry axis of the condenser lens, and a good alignment of the condenser lens with the remaining optical elements in an electron beam system may be achieved. Thus, the condenser lens arrangement, according to embodiments described herein, provides a good alignment of the optical components, and, at the same time, a stable emission of the beam, a high brightness and a small spot size can be provided.

In the state of the art, high brightness TFE (thermal field emitter) sources and electron optical designs with high beam energy inside the column of an electron beam system and a retarding field objective lens are mainly applied. The retarding field objective lens generates low aberration coefficients, both for chromatic and spherical aberration. Additionally, high beam energy inside the SEM column reduces electron-electron-interaction in high probe current systems, in which this effect becomes an additional performance limitation. FIG. 1a shows an electron optical system 100 including a TFE 110 and having a first beam path. Such known optical systems might also contain a condenser lens 120, to enable an adjustment of the spot size or the probe current by changing the system demagnification. Further, the electron optical system 100 includes an objective lens 130 as well as further elements of electron beam optics, such as an aperture 140. The condenser lens 120 and the objective lens 130 are exemplarily shown as magnetic lenses in the electron beam system 100 known in the art. The beam 150 is emitted from the TFE 110 and passes through the optical elements 120, 130, and 140, thereby being shaped and focused so as to provide a desired spot size and landing energy on the sample 160.

Partially and more recently, also optical columns having CFE (cold field emitter) cathodes are used. This cathode type has two benefits compared to the TFE: the CFE has a lower energy width compared to TFE, which results in less chromatic aberration (such as 0.3 eV instead of 0.6 eV), and the CFE provides a roughly 10× higher brightness than TFE sources. An example of a known electron beam system 105 having a CFE and a second beam path is shown in FIG. 1b. To generate optical beam paths with a CFE electron beam system having reasonable technical boundary conditions (i.e., reasonable working distance, containing alignment and correction systems for centering the beam, valves, blanker etc.), an optical system with one lens (such as only an objective lens) is not advantageous, because it delivers a system demagnification being too large. Consequently, an at least two lens system consisting of a condenser lens 125 and an objective lens 135 is required which delivers an overall demagnification of 10-1 dependent on the named applications. The basic beam path 155 is shown in FIG. 1b, which also exemplarily shows a beam booster 170. A beam booster as described herein may be understood as a device for accelerating the beam to a high potential and decelerating the beam to a low potential before hitting the probe. The high potential may be defined as being exemplarily ten times the low potential. In one embodiment, the high potential is 30 times greater than the low potential.

Generally, using a CFE source requires more sophisticated operation methods to achieve the required emission stability. This has in particular limited their usage in industrial applications. However, in the past, these limitations could mainly be solved by technical vacuum improvements and novel operation methods, which make a CFE implementation into SEMs more attractive within the mentioned applications. The CFE advantages include the potential that, in particular, retarding field optics or other low aberration objective lenses (like single pole piece lenses) can give an improved absolute resolution over TFE columns and a higher probe current in ranges adjacent to the optimum spot of higher probe currents. The diagram 200 in FIG. 2 shows a comparison of the spot size behavior of a TFE source and a CFE source.

As can be seen in diagram 200, CFE cathodes provide a higher brightness than TFE cathodes as well as a smaller virtual source size (e.g., 5 nm vs. 20 nm). Despite the beneficial effects of the CFE cathodes, these features also have some technical disadvantages. To take advantage from the superior brightness, the overall system demagnification must be smaller than in TFE optical systems. This, however, requires new optimization criteria in the electron beam system. In conventional optics, mainly the aberration optimization and centering of the objective lens is relevant (the condenser lens influences are demagnified and do not play a significant role in the state of the art).

However, in low demagnifying systems on the contrary, the condenser lens impact becomes increasingly important. Basically all design optimizations which are required for the objective lens (low chromatic and spherical aberrations, very good centering and alignment) should also be fulfilled for a condenser lens in an electron beam system having a CFE source.

Thus, it has been found that considering the following three requests for a condenser lens arrangement according to embodiments described herein seems to be advantageous: a short focal length to keep the aberrations low; preferably, a magnetic lens because the magnetic lens has superior performance over electrostatic lenses; and a well centered beam emitted from the CFE cathode, to avoid coma and off-axial aberrations. In particular, the well centered beam is difficult to achieve because the gun emits the electron beam in a direction which does not necessarily coincide with the axis going through the geometrical center of the condenser lens. Further, the short distance between a CFE tip and the condenser lens does not easily allow for beam alignment deflectors being placed between the CFE tip and the condenser lens.

One solution for the requirement of a well centered beam is to provide a mechanical alignment of the tip with respect to the condenser lens. Further, a mechanical alignment of the condenser lens relatively to the tip may be performed. However, a mechanical alignment of the CFE source or the condenser lens is difficult to achieve, because the CFE gun area requires stringent vacuum requirements.

According to embodiments described herein, a movable condenser lens is provided to solve this problem. The condenser lens arrangement, according to embodiments described herein, moves the condenser lens field in x- and/or y-direction by making use of deflection systems arranged in, close to or just before the condenser lens. In a condenser lens arrangement according to embodiments described herein, magnetic deflectors are used.

Figure 3:
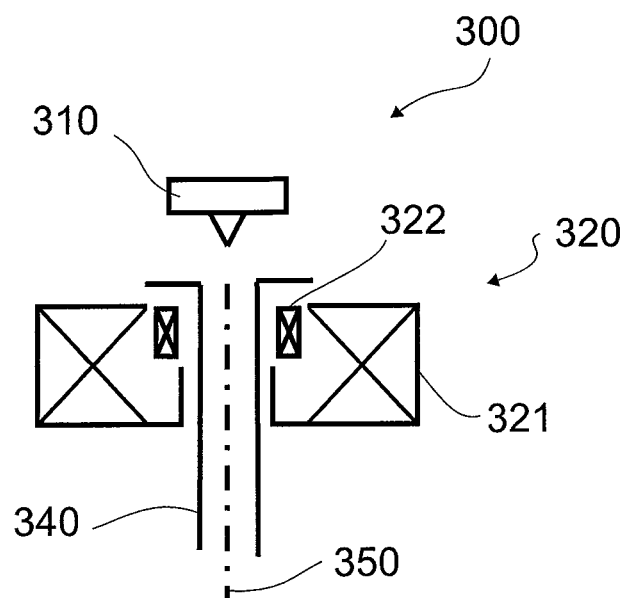
FIG. 3 shows a schematic view of a condenser lens arrangement according to embodiments described herein.

An example of how to realize the moving condenser lens (MOCOL) arrangement is shown in FIG. 3. FIG. 3 refers to a condenser lens arrangement 320 in a partly shown electron beam system 300 including a CFE gun 310 and a vacuum system with differential pumping section (not shown) to achieve the required tip vacuum in a range of exemplarily about $10^{-11}$ to $10^{-12}$ Torr. Further, a part of a beam booster 340 is shown. According to some embodiments, the condenser lens arrangement 320 includes a magnetic condenser lens 321 and a magnetic deflector 322. An axis 350 shows the symmetry axis of the condenser lens 321.

Figure 4:
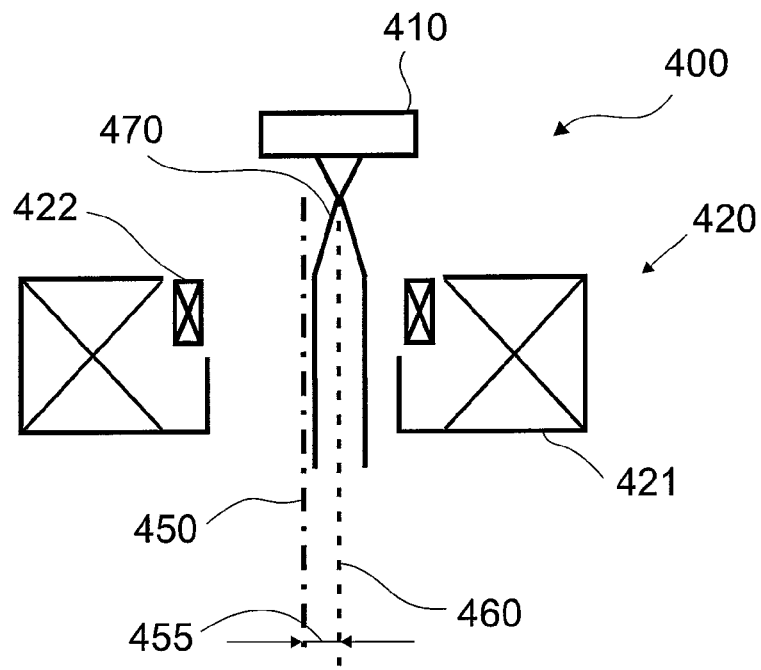
FIG. 4 shows a schematic view of a condenser lens arrangement according to embodiments described herein.

With an arrangement according to embodiments described herein, the beam may be emitted in a direction within the mechanical tolerances of the gun arrangement, i.e. the beam may be emitted along a beam emitter axis. Normally, the beam running along the beam emitter axis will not meet the symmetry axis of the condenser lens. FIG. 4 shows a condenser lens arrangement 420 according to embodiments described herein in a (partly shown) electron beam system 400. The condenser lens arrangement 420 includes a condenser lens 421 and a magnetic deflector 422. A beam 470 is emitted from an emitter 410 along a beam emitter axis 460. The condenser lens 421 of the condenser lens arrangement 420 has a symmetry axis 450.

As stated above, the symmetry axis of the condenser lens 421 may be defined dependent on the geometry of the condenser lens 421. In the example shown in FIG. 4, the symmetry axis 450 of the condenser lens 421 may be arranged along the z-direction at the geometrical center of the magnetic condenser lens.

In known condenser lenses, the optical axis of the electron beam system is defined by the symmetry axis of the condenser lens. However, in the case that the optical axis does not coincide with the beam emitter axis, this results in a misalignment of the beam, and, thus, in a poor operation quality of the electron beam system.

As can be seen in FIG. 4, the symmetry axis 450 of the condenser lens 421 and the beam emitter axis 460 of the electron beam system 400 are not coincident, but have a distance 455 to each other in a plane perpendicular to the symmetry axis 450 of the condenser lens 421 or the beam emitter axis 460 of the condenser lens arrangement 420.

Generally, a distance between the symmetry axis of the condenser lens and the beam emitter axis of the condenser lens arrangement may be caused by a misaligned emitter, an off-centric emission of the beam, or the like. For instance, also mechanical tolerances in the emitter module set up, or mechanical tolerances both of the gun chamber and the condenser lens may lead to a mismatch.

According to some embodiments, it can be checked by an alignment check (defocus, excitation wobble), whether the beam meets the symmetry axis of a condenser lens, i.e. whether the beam emitter axis coincides with the symmetry axis of the condenser lens. Elements and devices, which allow for an alignment check, may be part of a condenser lens arrangement or a beam optical system according to embodiments described herein. In the condenser lens arrangement according to embodiments described herein, the deflector will be activated in the case that the beam does not meet the symmetry axis of the condenser lens. The deflector in a condenser lens arrangement, according to embodiments described herein, may virtually move the condenser lens in x- and/or y- direction (while the symmetry axis, as well as the optical axis, substantially have an extension in the z-direction).

According to some embodiments described herein, the deflector 422 of the condenser lens arrangement 420 generates a magnetic field, which overlaps with the magnetic field of the condenser lens 421. By the superposition of the magnetic field of the condenser lens 421 and the magnetic field of the deflector 422, the optical axis of the condenser lens arrangement may be movable with respect to the symmetry axis of the condenser lens. Thus, the optical axis of the condenser lens arrangement may be placed dependent on the beam emitter axis, and the axis of the condenser lens field is adapted to the situation of the beam. According to some embodiments, the optical axis of the condenser lens arrangement, being coincident with the symmetry axis of the condenser lens before operation of the deflector of the condenser lens arrangement, is shifted away from the symmetry axis of the condenser lens during operation of the deflector. In other words, the optical axis of the condenser lens arrangement is shifted from the symmetry axis of the condenser lens to the beam emitter axis when the magnetic deflector generates a magnetic deflector field.

According to some embodiments, no further deflection except the deflection of the magnetic deflector 422 of the condenser lens arrangement may be required before the beam enters the condenser lens. For instance, no pre-deflection is required in a condenser lens arrangement according to embodiments described herein.

In some embodiments, the beam may not only be shifted away from the symmetry axis of the condenser lens, but may also be tilted with respect to the symmetry axis of the condenser lens, i.e. the beam may provide a certain angle between the beam emitter axis and the symmetry axis of the condenser lens. According to some embodiments, which may be combined with other embodiments described herein, means may be provided for influencing the tilt of the beam, as described in detail below.

The magnetic deflector of the condenser lens arrangement according to embodiments described herein may be arranged in the condenser lens. According to other embodiments described herein, the magnetic deflector of the condenser lens arrangement may be arranged close before the condenser lens, such as between the emitter and the condenser lens. The distance between the emitter and the condenser lens arrangement may typically be between about 0 mm and about 25 mm, more typically between about 0 mm and about 20 mm, and even more typically between about 5 mm and about 15 mm.

As explained above, special design considerations may be required for an electron beam system having a CFE. In particular, when designing the condenser lens, challenging tasks are the short focal length to keep the aberrations low, and the well centered beam to avoid coma and off-axial aberrations. With the condenser lens arrangement according to embodiments described herein, it is possible to fulfill the above requirements, while providing a high brightness and a small spot size, irrespective of the design limitations, such as small space, if any, between the emitter and the condenser lens arrangement.

Figure 5:
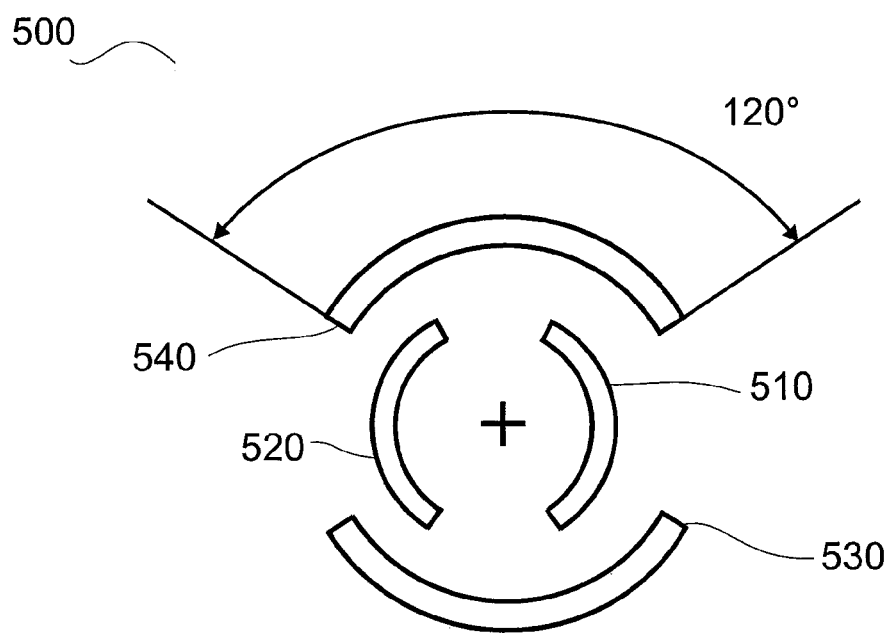
FIG. 5 shows a schematic top view of a deflector of a condenser lens arrangement according to embodiments described herein.

According to embodiments described herein, the condenser lens arrangement includes a magnetic deflector for generating a magnetic deflector field. As can exemplarily be seen in FIG. 5, the deflector is a magnetic deflector 500 including magnetic coils 510, 520, 530 and 540 including conductor loops. In the example of a deflector shown in FIG. 5, two coils 510 and 520 are positioned along a first ring and two coils 530 and 540 are positioned along a second ring which is exemplarily concentric with the first ring. The four coils are positioned in a manner that, when seen from the center of the rings, every coil 510 and 520, positioned on the first ring, overlaps with the two coils 530 and 540, positioned on the second ring. By design, the fields of the coils may be shaped, such that for instance parasitic hexapole fields can be avoided, e.g. by using coils covering a certain angle. The coils 510, 520, 530, and 540 are designed so that the angle covered by a single coil is typically between about 90° and 150°, more typically between about 100° and 140°, and even more typically between about 110° and 130°. In one embodiment, the angle covered by a coil is about 120°.

According to some embodiments, two coils of coils 510 to 540 (such as coils 510 and 520) may be adapted to influence the condenser lens field in the x-direction, while the respective other two coils of coils 510 to 540 (such as coils 530 and 540) may be adapted to influence the condenser lens field in the y-direction.

In the condenser lens arrangement, according to embodiments described herein, the optical axis of the condenser lens arrangement may be shifted away from the symmetry axis of the condenser lens to a position which is displaced substantially parallel to the symmetry axis of the condenser lens. The optical axis of the condenser lens arrangement may thus be described as being movable. According to some embodiments, the optical axis of the condenser lens arrangement may be described as being shifted to the beam emitter axis, on which the beam proceeds from the emitter, particularly relative to the symmetry axis of the condenser lens.

According to some embodiments, which may be combined with other embodiments described herein, the coils of the deflector of the condenser lens arrangement may have a toroid-like shape or at least a partly toroid-like shape. According to yet further embodiments described herein, the coils of the deflector of the condenser lens arrangement may be saddle coils. The deflector may generate a magnetic field that is substantially orthogonal to the beam emitter axis. Further, the distribution of the magnetic field of the deflector of the condenser lens arrangement may be proportional to the first derivative of the magnetic field of the condenser lens. Thus, eddy currents produced by rapidly changing magnetic field's of the deflector may be eliminated.

In the deflector of a condenser lens arrangement, according to embodiments described herein, aberrations caused by the deflector may be decreased, when cosine coils are used for the deflector of the condenser lens system.

Figure 6:
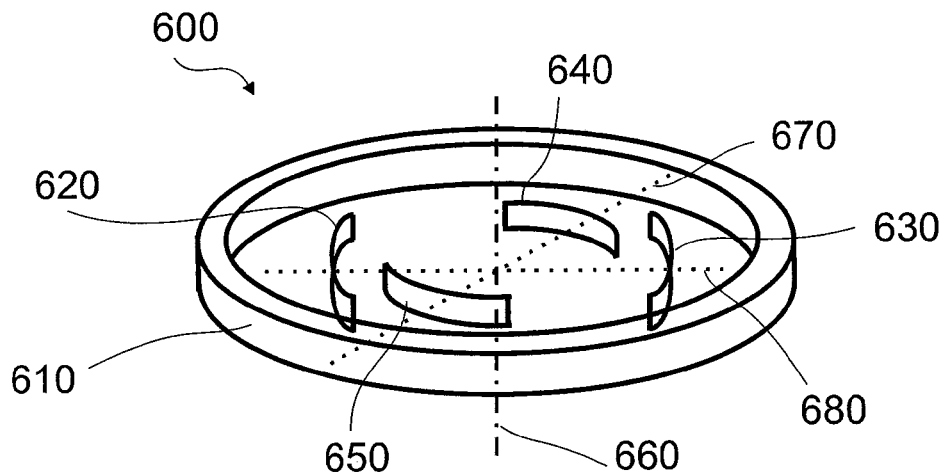
FIG. 6 shows a schematic view of a condenser lens arrangement according to embodiments described herein.

FIG. 6 shows a schematic view of a condenser lens arrangement 600 according to some embodiments described herein. The condenser lens arrangement 600 includes a magnetic condenser lens 610 and a magnetic deflector including coils 620, 630, 640, and 650. The coils 620 to 650 may be coils as described above, for instance as described with respect to FIG. 5. Further, the geometrical axis 660 of the condenser lens 620 in z-direction is shown. The coils 620 to 650 each may encompass a certain angle, such as an angle of 120°. In the embodiment exemplarily shown in FIG. 6, two coils are provided for displacing the optical axis of the condenser lens arrangement in x-direction 670, and two further coils are provided for displacing the optical axis of the condenser lens arrangement in y-direction 680.

Figure 7:
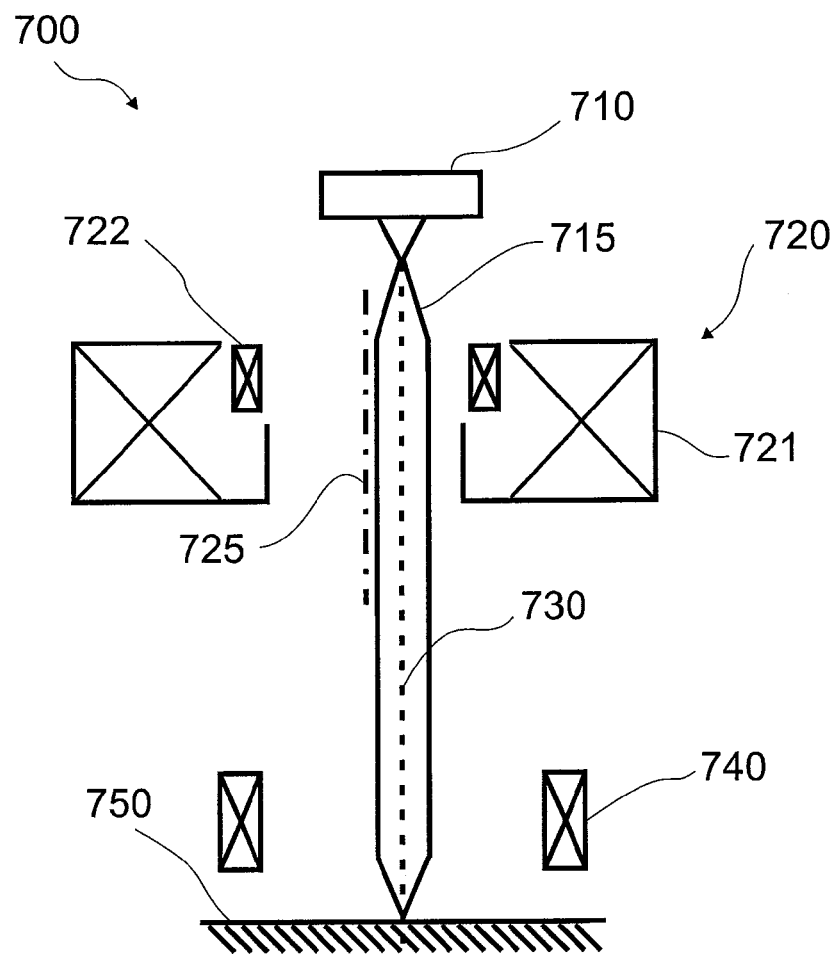
FIG. 7 shows a schematic view of an electron beam system having a condenser lens arrangement according to embodiments described herein.

FIG. 7 shows an electron beam optical system 700 according to embodiments described herein. The electron beam optical system 700 may include a beam emitter 710 for emitting an electron beam 715. The electron beam optical system 700 may have a condenser lens arrangement 720, including a condenser lens 721 and a deflector 722, as exemplarily described above with respect to FIGS. 3 to 6. According to some embodiments, the beam 715 emitted from the emitter 710 is not aligned with the symmetry axis 725 of the condenser lens 721. Thus, the magnetic field of the condenser lens 721 may be moved by the superposition of the magnetic field of the condenser lens 721 and the magnetic field of the deflector 722. As a result, the optical axis 730 of the condenser lens arrangement 700 is displaced with respect to the symmetry axis 725 of the condenser lens 721. The impact of the condenser lens 721 is thus adapted to the beam path of the beam emitted from the beam emitter. By moving the optical axis of the condenser lens arrangement, the condenser lens has the best impact on the electron beam 715 at the optical axis 730, and not on the symmetry axis 725 of the condenser lens 721 anymore.

According to some embodiments, the electron beam optical system 700 may further include an objective lens 740, beam apertures, beam boosters, and further beam optical elements which are not shown in FIG. 7 for the sake of a better overview. The beam optics may be adapted for focusing the electron beam 715 on a sample 750, thereby providing a stable and reliable operation.

According to some embodiments, which can be combined with other embodiments described herein, the emitter described herein may be a CFE. In the electron beam optical system, the magnetic deflector of the condenser lens arrangement is in or close before the condenser lens, when seen in a downstream direction of the particle beam. According to some embodiments described herein, the distance between the emitter of the electron beam system and the condenser lens arrangement may typically be between 0 mm and 20 mm. A distance of 0 mm may mean that the emitter tip immerges in the condenser lens arrangement or even the condenser lens field according to embodiments described herein.

The electron beam system, as described herein, may also include elements for an alignment check to find out whether the movable condenser lens is aligned with the electron beam. A tilted penetration of the condenser lens may be a further issue in an electron beam system. However, in some cases, this might be within a tolerable range. Where this is not the case, a mechanical tilt of the gun or emitter in x- and y-direction may be performed by respective tilt compensation elements. The tilt compensation elements may influence the tilt position of the emitter and, thus, may have a tilt impact of the beam entering the condenser. This may mean that an angle being present between the symmetry axis of the condenser lens and the beam emitter axis may be influenced and decreased. In some embodiments, the tilt angle may be substantially extinguished so that the beam is emitted substantially parallel to the symmetry axis of the condenser lens. After the tilt compensation, the condenser lens might be moved again, as described above, to compensate for the translation of the beam. According to some embodiments, this process may be repeated iteratively until a very good alignment of the beam in the condenser lens (regarding on-axis and tilt) is achieved.

According to further embodiments described herein, a method is provided for moving a condenser lens in a condenser lens arrangement. Moving a condenser lens may include moving the optical axis of the condenser lens arrangement so as to be parallel to the position before moving the condenser lens. According to one aspect, moving the condenser lens may include moving the condenser lens field so that the optical axis of the condenser lens arrangement is aligned with the beam emitter axis. The condenser lens arrangement may be a condenser lens arrangement as described above.

Figure 8:
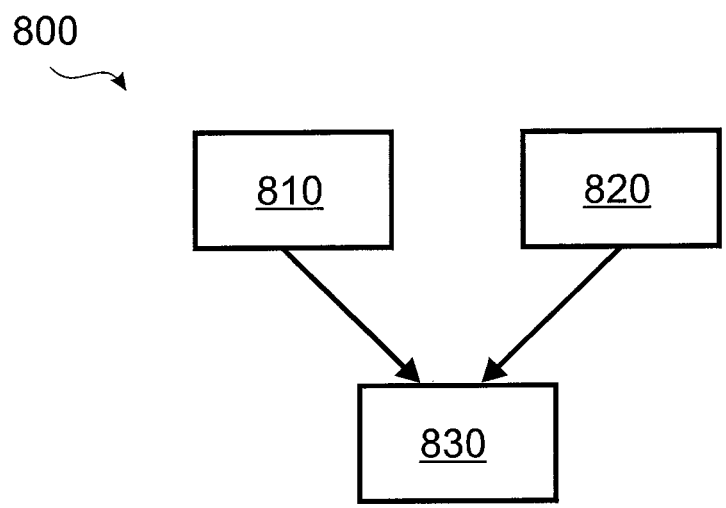
FIG. 8 shows a flow chart of a method for moving a condenser lens according to embodiments described herein; and, FIG. 9 shows a flow chart of a method for moving a condenser lens according to embodiments described herein.

FIG. 8 shows an example of a flow chart 800 of the herein described method. In block 810, a first magnetic field is generated by a condenser lens. According to embodiments described herein, the condenser lens has a symmetry axis which may depend on the geometry of the condenser lens. Block 820 includes generating a second magnetic field with a magnetic deflector. According to some embodiments described herein, the second magnetic field may be generated by an x-y-deflector, which is adapted to move the condenser lens field in the x- as well as in the y-direction. The method 800 further includes in block 830 superposing the second magnetic field of the deflector and the first magnetic field of the condenser lens to move the optical axis of the condenser lens arrangement relative to the symmetry axis of the condenser lens. According to some embodiments, the condenser lens may be moved until the condenser lens is aligned with the beam emitted from the emitter. This may mean that the location of the condenser lens field having the best and desired impact on the beam is moved towards the beam. In this way, the optical axis can be moved to the beam running displaced from the symmetry axis of the condenser lens before the optical axis is moved by the superposition of the two magnetic fields.

Figure 9:
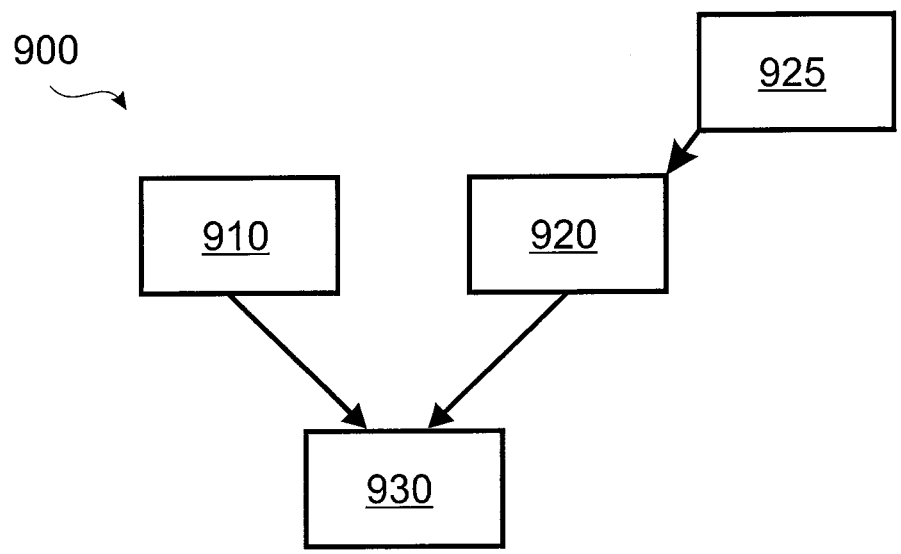

The flow chart of FIG. 9 shows an aspect of the method as described herein. According to some embodiments, the blocks 910, 920 and 930 may correspond substantially to the blocks 810, 820 and 830 described with respect to FIG. 8. The method shown by flow chart 900 in FIG. 9 further includes block 925. In block 925, the second magnetic field produced by the magnetic deflector is proportional to the first derivative of the first magnetic field produced by the magnetic condenser lens, In some embodiments, the deflector may be controlled so as to satisfy the above condition.

According to some embodiments, the method may also include checking the alignment of the condenser lens with the beam until the beam runs on to the moved optical axis of the condenser lens arrangement. This may be performed by a control loop and respective elements adapted for checking the alignment. According to some embodiments, the alignment check may be performed after an emitter tilt has been influenced by mechanically tilting the emitter.

While the foregoing is directed to embodiments of the invention, other and further embodiments of the invention may be devised without departing from the basic scope thereof, and the scope thereof is determined by the claims that follow.

What I claim is:

1. A condenser lens arrangement for an electron beam being generated from an electron beam emitter in an electron beam system, comprising:
    a magnetic condenser lens adapted for generating a magnetic condenser lens field, the condenser lens having a symmetry axis; and
    a magnetic deflector adapted for generating a magnetic deflector field;
    wherein the deflector is configured so that the superposition of the magnetic condenser lens field and the magnetic deflector field results in an optical axis of the condenser lens arrangement being movable relative to the symmetry axis of the condenser lens;
    wherein the deflector is configured to compensate for a displacement of the emitter in an x-direction and/or in a y-direction;
    wherein the distance between the emitter and the condenser lens arrangement is between about 0 mm and about 25 mm; and
    wherein the deflector of the condenser lens arrangement is the only deflector between the emitter and the condenser lens arrangement.

2. The condenser lens arrangement according to claim 1, wherein the deflector is a magnetic x-y-deflector having magnetic deflection coils, particularly, wherein the deflector has two magnetic deflection coils for each of the x-direction and the y-direction.

3. The condenser lens arrangement according to claim 1, wherein the magnetic deflector comprises a coil having a toroid-like shape.

4. The condenser lens arrangement according to claim 1, wherein the magnetic deflector comprises a saddle coil.

5. The condenser lens arrangement according to claim 2, wherein a coil of the deflector encompasses an angle of about 120 degree.

6. An electron beam optical system comprising:
a particle beam emitter for generating a beam of charged particles;
a condenser lens arrangement comprising:
a magnetic condenser lens adapted for generating a magnetic condenser lens field, the condenser lens having a symmetry axis; and
a magnetic deflector adapted for generating a magnetic deflector field;
wherein the deflector is configured so that the superposition of the magnetic condenser lens field and the magnetic deflector field results in an optical axis of the condenser lens arrangement being movable relative to the symmetry axis of the condenser lens; wherein the deflector is configured to compensate for a displacement of the emitter in an x-direction and/or in a y-direction; wherein the distance between the emitter and the condenser lens arrangement is between about 0 mm and about 25 mm; wherein the deflector of the condenser lens arrangement is the only deflector between the emitter and the condenser lens arrangement; and
an objective lens for focusing the particle beam on a specimen.

7. The electron beam optical system according to claim 6, wherein the emitter is a cold field emitter.

8. The electron beam optical system according to claim 6, wherein the distance between the particle beam emitter and the condenser lens of the condenser lens arrangement is between about 0 mm and about 20 mm.

9. The electron beam optical system according to claim 6, wherein the distance between the particle beam emitter and the condenser lens of the condenser lens arrangement is between about 5 mm and about 15 mm.

10. The electron beam optical system according to claim 6, wherein the deflector of the condenser lens arrangement is configured so that the superposition of the magnetic condenser lens field and the magnetic deflector field results in the optical axis of the condenser lens arrangement being shifted away from the symmetry axis of the condenser lens to a position which is displaced substantially parallel to the symmetry axis of the condenser lens.

11. The electron beam optical system according to claim 6, wherein the deflector of the condenser lens arrangement is a magnetic x-y-deflector having magnetic deflection coils, particularly, wherein the deflector has two magnetic deflection coils for each of the x-direction and the y-direction.

12. The electron beam optical system according to claim 11, wherein a coil of the deflector encompasses an angle of about 120.degree.

13. The electron beam optical system according to claim 6, wherein the particle beam emitter is adapted to be mechanically movable for compensating a tilt of the particle beam emitter.

14. A method for moving a condenser lens in a condenser lens arrangement, comprising: generating a first magnetic lens field with a magnetic condenser lens having a symmetry axis; generating a second magnetic field with a magnetic deflector; and compensating for a displacement of an emitter in an x-direction and/or in a y-direction by superposing the second magnetic field of the deflector with the first magnetic field of the condenser lens to move an optical axis of the condenser lens arrangement relative to the symmetry axis of the condenser lens; wherein the distance between an emitter and the condenser lens arrangement is between about 0 mm and about 25 mm; and wherein the magnetic deflector of the condenser lens arrangement is the only deflector between the emitter and the condenser lens arrangement.

15. The method according to claim 14, wherein generating the second magnetic field comprises generating the second magnetic field by a magnetic x-y-deflector.

16. The method according to claim 14, wherein generating the second magnetic field by the magnetic deflector comprises generating the second magnetic field being proportional to the first derivative of the first magnetic field produced by the magnetic condenser lens.

17. The method according to claim 14, wherein superposing the first magnetic field of the condenser lens and the second magnetic field of the deflector comprises arranging the deflector in the condenser lens.

18. The method according to claim 14, wherein superposing the second magnetic field of the deflector with the first magnetic field of the condenser lens to move the optical axis of the condenser lens arrangement comprises shifting the optical axis of the condenser lens arrangement away from the symmetry axis of the condenser lens to a position which is displaced substantially parallel to the symmetry axis of the condenser lens.

* * * * *